US006570165B1

(12) United States Patent
Engdahl et al.

(10) Patent No.: US 6,570,165 B1
(45) Date of Patent: May 27, 2003

(54) RADIATION ASSISTED ELECTRON EMISSION DEVICE

(76) Inventors: John C. Engdahl, 785 N. Waukegan Rd., Lake Forest, IL (US) 60045; Douglas S. McGregor, P.O. Box 130414, Ann Arbor, MI (US) 48113-0414; Ronald A. Rojeski, 863 Palomino Dr. Apt. A, Pleasanton, CA (US) 94566

( * ) Notice: Subject to any disclaimer, the term of this patent is extended or adjusted under 35 U.S.C. 154(b) by 0 days.

(21) Appl. No.: 09/475,155

(22) Filed: Dec. 30, 1999

(51) Int. Cl.[7] ............... G01N 9/04; G06M 7/00; H01J 46/14; G01J 1/24; G01T 1/24
(52) U.S. Cl. ............... 250/423 P; 250/370.11
(58) Field of Search ............... 313/310; 250/423 P, 250/370.11

(56) References Cited

U.S. PATENT DOCUMENTS

| | | | | |
|---|---|---|---|---|
| 4,331,505 A | * | 5/1982 | Hirt ............... | 216/48 |
| 4,728,851 A | * | 3/1988 | Lambe ............... | 313/309 |
| 5,138,220 A | * | 8/1992 | Kirkpatrick ............... | 313/309 |
| 5,262,649 A | * | 11/1993 | Antonuk et al. ............... | 250/370.11 |
| 5,543,684 A | * | 8/1996 | Kumar et al. ............... | 313/292 |
| 5,693,947 A | * | 12/1997 | Morton ............... | 250/370.09 |
| 5,780,858 A | * | 7/1998 | Waechter et al. ............... | 250/370.09 |
| 5,780,960 A | * | 7/1998 | Vickers ............... | 313/310 |
| 5,821,680 A | * | 10/1998 | Sullivan et al. ............... | 313/309 |
| 6,211,608 B1 | * | 4/2001 | Raina et al. ............... | 313/309 |
| 6,362,484 B1 | * | 3/2002 | Beyne et al. ............... | 250/338.4 |
| 6,384,400 B1 | * | 5/2002 | Albagli et al. ............... | 250/370.11 |

* cited by examiner

Primary Examiner—Jack Berman
Assistant Examiner—Johnnie L Smith, II
(74) Attorney, Agent, or Firm—Rothwell, Figg, Ernst & Manbeck (57) ABSTRACT

A radiation assisted electron emission device uses semiconductor or semi-insulator material formed with an emission mechanism such as a field emission tip, a thermionic emission device, or a negative electron affinity emitter as a source of electrons. The material is irradiated with a source of radiation, such as electromagnetic radiation, neutron radiation, or charged particle radiation, which excites electron-hole pairs in the material to generate a population of free conducting electrons. The electrons are driven to the emission mechanism by a suitable transport process, such as diffusion or drift. The electron emission device has applicability to a broad range of technologies where an electron beam or current is used.

15 Claims, 8 Drawing Sheets

TO ELECTRON AMPLIFIER
(SUCH AS PHOTOMULTIPLIER TUBE)

FIG.4

TO ELECTRON AMPLIFIER,
MEASURING SYSTEM OR TARGET

FIG.5

TO ELECTRON AMPLIFIER, MEASURING
SYSTEM OR TARGET

RADIATION ASSISTED ELECTRON EMISSION DEVICE

BACKGROUND OF THE INVENTION

1. Field of the Invention

The present invention relates generally to electron sources, and more particularly to an electron emission source that is driven into an electron emissive state with the assistance of radiation, such as photon emission from a radiation source.

2. Background and Prior Art

Electron emission sources are generally known in the art, and have applicability in many areas of technology which use electron beams, such as vacuum microelectronics applications, semiconductor device manufacturing, electron beam exposure apparatus, electron microscopes, flat panel display devices, radiation spectrometers and imagers, etc.

Various techniques of generating a source of electron beam emission are known in the art, including thermionic emission, field emission and negative electron affinity emission. The surface of any. conducting solid material presents an energy barrier that binds to the host material. Electrons incident upon the energy barrier at energy levels capable of surmounting the barrier may leave the solid, and thus give rise to an emission current.

Thermionic emission is generally achieved by heating a filament to high temperatures, by which electrons gain enough energy to surmount the energy barrier and leave the heated surface. The emission current density of a thermionic emission electron source is given by $$J = AT^2 \exp(-w/kT) \quad (1)$$

where A is a constant, T is the temperature of the source material in degrees Kelvin, k is the Boltzmann constant, and w is the work function of the source material.

Another method of generating electron emission is by altering the energy barrier to make it very thin, whereby electrons can tunnel through it, or to make it very small whereby electrons do not encounter any appreciable barrier to hinder their emission from the surface of the material.

Field emission cathodes present a different mode of emission from a surface than thermionic emission. A field emission source has a tip fashioned from a conducting material such that the energy barrier is very thin. Because contamination of the field emission tip can inhibit emission, field emission electron sources work best when the tip is exposed only to a vacuum.

Another mode of emission is provided by negative electron affinity devices. In such devices a coating is applied to a surface that produces "bends" in the energy bands such that there is no barrier present to prevent the emission of electrons into a vacuum. Hence negative electron affinity emission also generally is carried out where the treated surface is exposed only to a vacuum.

Regardless of the material, electron emission is best realized where the material has a large density of freely conducting electrons. For this reason, degenerately doped semiconductor materials are often used for both field emission and negative electron affinity devices, because of the high density of freely conducting electrons present in the material. Emission achieved primarily by increasing the voltage drop across the emission region of the device.

There exists a need in the art for improvement in such electron emission devices, and specifically to provide electron emission devices that can use semiconducting material that does not have to be degeneratively doped.

SUMMARY OF THE INVENTION

The present invention overcomes the disadvantages discussed above by providing an electron emission device that can be manufactured from a semiconductor material that is very pure (i.e., with a very low doping concentration), or from a semi-insulating material that has a very low doping concentration.

The device according to the present invention uses the change in conductivity caused by interactions of ionizing radiation within the device to increase the population of free electrons near the surface of the device. The ionizing radiation can be provided by any suitable mode of radiation, such as electromagnetic radiation, charged particle radiation, or neutron radiation. The free electrons excited by the ionizing radiation either can drift or diffuse to the emission region, whereby the conductivity in the emission region increases, allowing for increased electron emission from the emission region.

In particular, the present invention provides a radiation assisted electron source, including semiconducting or semi-insulating material capable of producing electron-hole pairs, a source of radiation for providing incident radiation to the material, the incident radiation exciting electron-hole pairs within the material, an emission mechanism formed in the material, and a transport mechanism for driving electrons of the electron-hole pairs to a local region of the emission mechanism, where the electrons are released from the emission mechanism to provide an electron beam.

BRIEF DESCRIPTION OF THE DRAWINGS

The present invention will become more fully understood from the detailed description given hereinbelow and the accompanying drawings, which are given by way of illustration only and which are not limitative of the present invention, and wherein.

DETAILED DESCRIPTION OF THE PREFERRED EMBODIMENTS

The present invention provides an electron emission source wherein the device is made from semiconducting or semi-insulating material, and wherein the electron emission may be from a thermionic emission tip, a field emission tip, a negative electron affinity region, or any other emission mechanism. Ionizing radiation is allowed to interact within the emission region of the emission mechanism, or in a region proximate the emission region made from the same material as the emission region. Freely conductive electrons excited by the ionizing radiation either are diffused to the emission region of the emission mechanism, drifted to the emission region by external or internal voltage potential, or migrate to the emission region by a combination of diffusion and drifting.

Upon reaching the emission region, the electrons provide a high density of electrical charge, which changes the conductivity in the local region of the emission mechanism to allow electron emission to occur. Electron emission is controlled by controlling the ionizing radiation applied to the device to cause electron emission from the emission mechanism. Emission may be controlled to be either continuous or in discrete packets. In the latter case, once the packet of electrons leaves the emission region and exits the device, emission stops until another packet of electrons excited by the ionizing radiation arrives in the local region of the emission mechanism.

Figure 1:
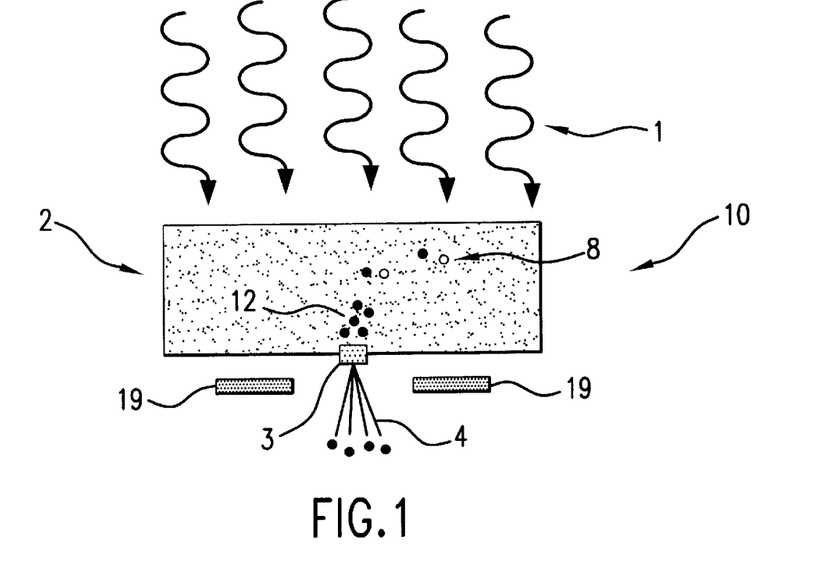
FIG. 1 is a diagram of a radiation assisted electron emission device according to a general embodiment of the present invention.

Referring now to FIG. 1, a cross section of a basic form of radiation assisted electron emission device (RAEED) 10 is shown. Ionizing radiation 1, such as photons (elg., visible, X-ray, gamma-ray, etc.), neutrons, or charged particles (e.g., beta, alpha, heavy ions, electrons, etc.) strike or impinge upon a semiconducting or semi-insulating material 2 at location proximate the local region of emission mechanism 3. Mechanism 3 is any mechanism through which electrons may be emitted from a material, such as a thermionic mechanism, a field emission mechanism, or a negative electron affinity mechanism.

The absorbed radiation causes ionization in the material 2, thereby generating electron-hole pairs 8. Electrons 12 are driven to the emission region of the mechanism 3 by a transport process such as diffusion, drift or a combination of the two, and electrons 4 are emitted from the surface of the mechanism 3. Voltage potential is applied to extractor grids 19 to assist in the extraction of electrons 12 from the material and/or to focus the emitted electrons 4 that have left the material into a directed beam.

Figure 2:
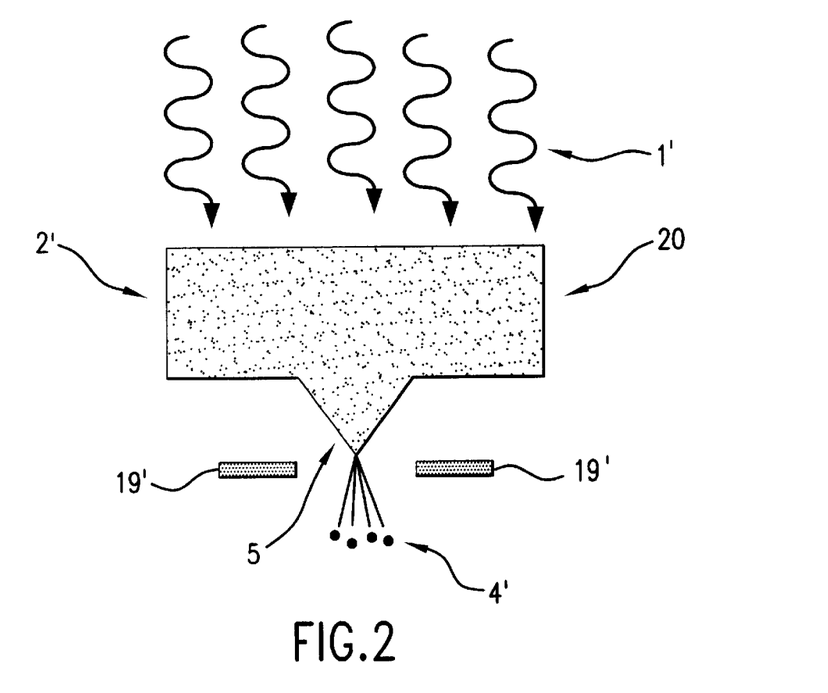
FIG. 2 is a diagram of a radiation assisted electron emission device according to a second embodiment of the present invention.

FIG. 2 shows an example of an RAEED 20 of the invention wherein the emission mechanism is a field emission tip 5. Electrons excited by the ionizing radiation 1' are driven to the local region of the field emission tip 5, wherein the energy barrier is very thin, allowing the excited electrons to exit the material to form a beam of electrons 4'. Optional extractor grids 19' can be provided to assist in electron extraction or to focus the emitted electrons into a directed beam.

Figure 3:
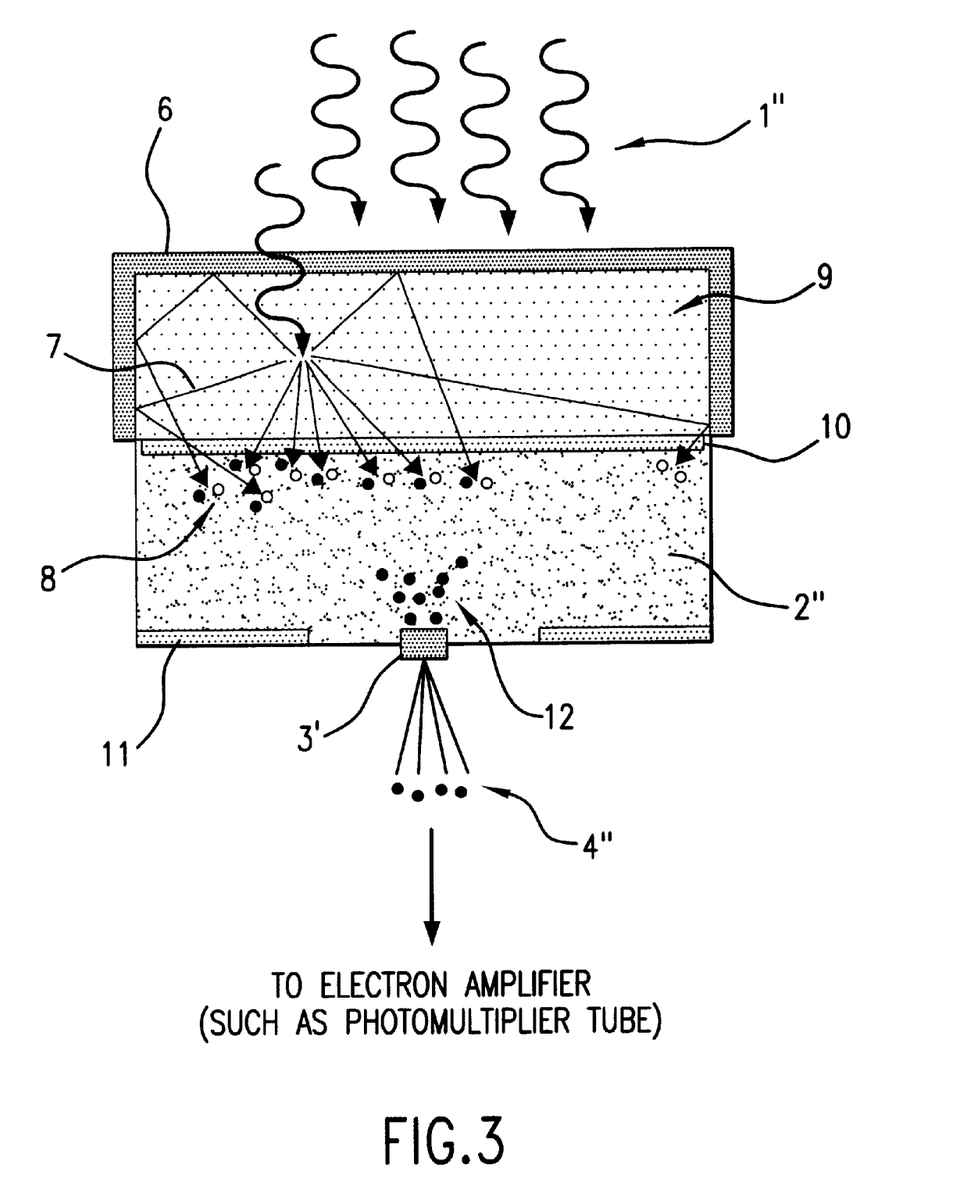
FIG. 3 is a diagram of a first possible application of a radiation assisted electron emission device according to the general embodiment of the present invention.

FIG. 3 illustrates an application of the RAEED of the present invention as a radiation detector. Photons 1", such as gamma-rays, X-rays or other photon radiation, enter into a scintillating material 9 (such as a scintillation crystal) wherein the absorbed photons interact with the scintillating material to cause it to emit photons 7 of different electromagnetic energy or wavelength (such as visible light photons).

Figure 4:
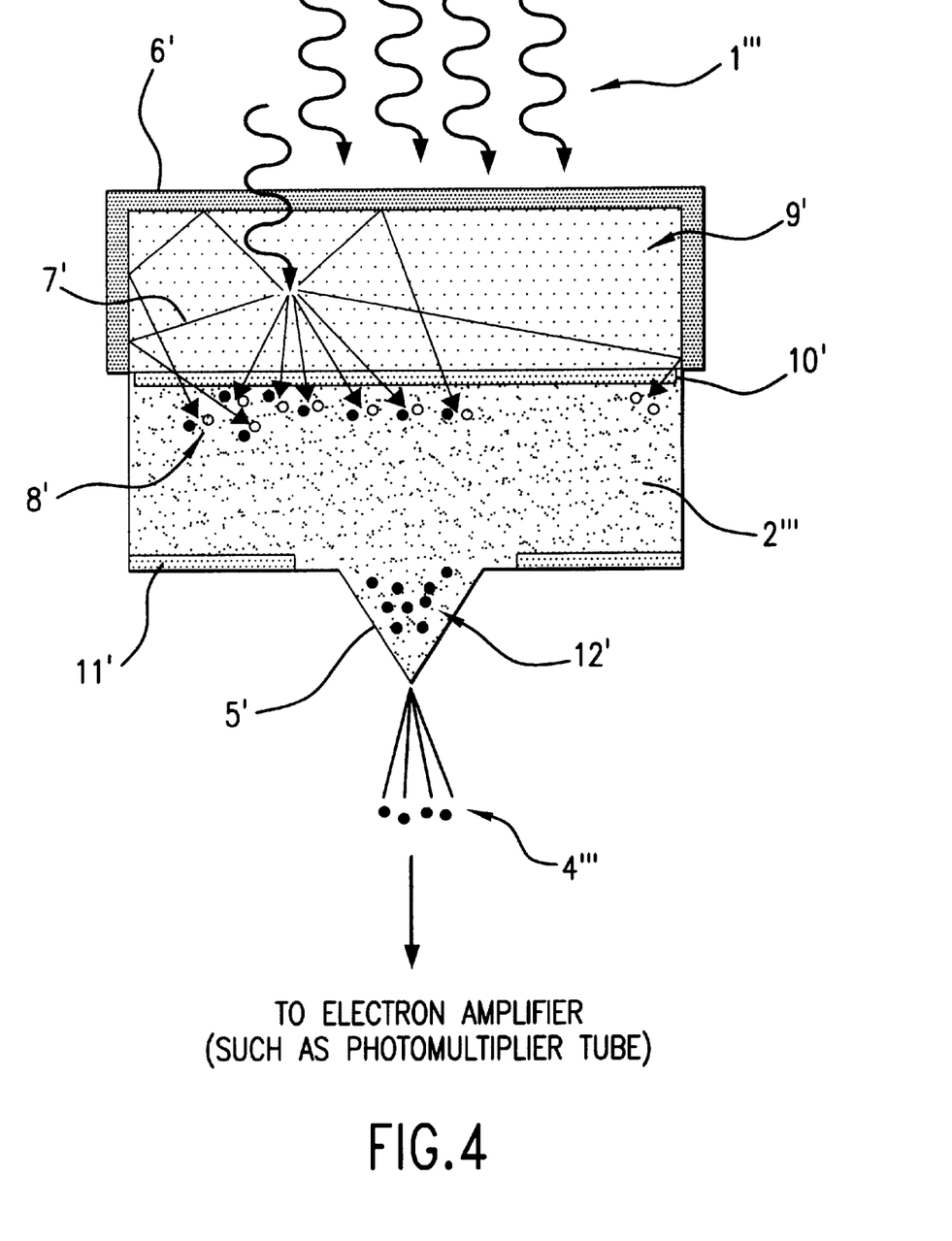
FIG. 4 is a diagram of the first possible application of a radiation assisted electron emission device according to the second embodiment of the present invention.

The photons 7 are reflected by a reflector 6 into a semiconducting or semi-insulating material 2", where they excite electron-hole pairs 8. Electrical contacts 10 and 11 (such as conductive metals or p-type or n-type semiconductor material) are provided on the opposite surfaces of the material 2", whereby the voltage potential across the material 2", from one side to the other may be varied (e.g., made negative, positive, or grounded). Electrons 12 from the excited electron-hole pairs are driven to the emission region of mechanism 3 either by drift or by diffusion from an appropriate applied voltage potential to contacts 10 and 11, or a combination of drift and diffusion, where they are emitted as electrons 4". The emitted electrons then can be fed to an amplifier such as a photomultiplier dynode bank, avalanche photodiode, or other electron amplifier, to produce a signal proportional to the amount of radiation 1" impinging on the device. FIG. 4 shows an example of a radiation detector using the RAEED of the present invention wherein the emission mechanism 3 is a field emission tip 5'.

Figure 5:
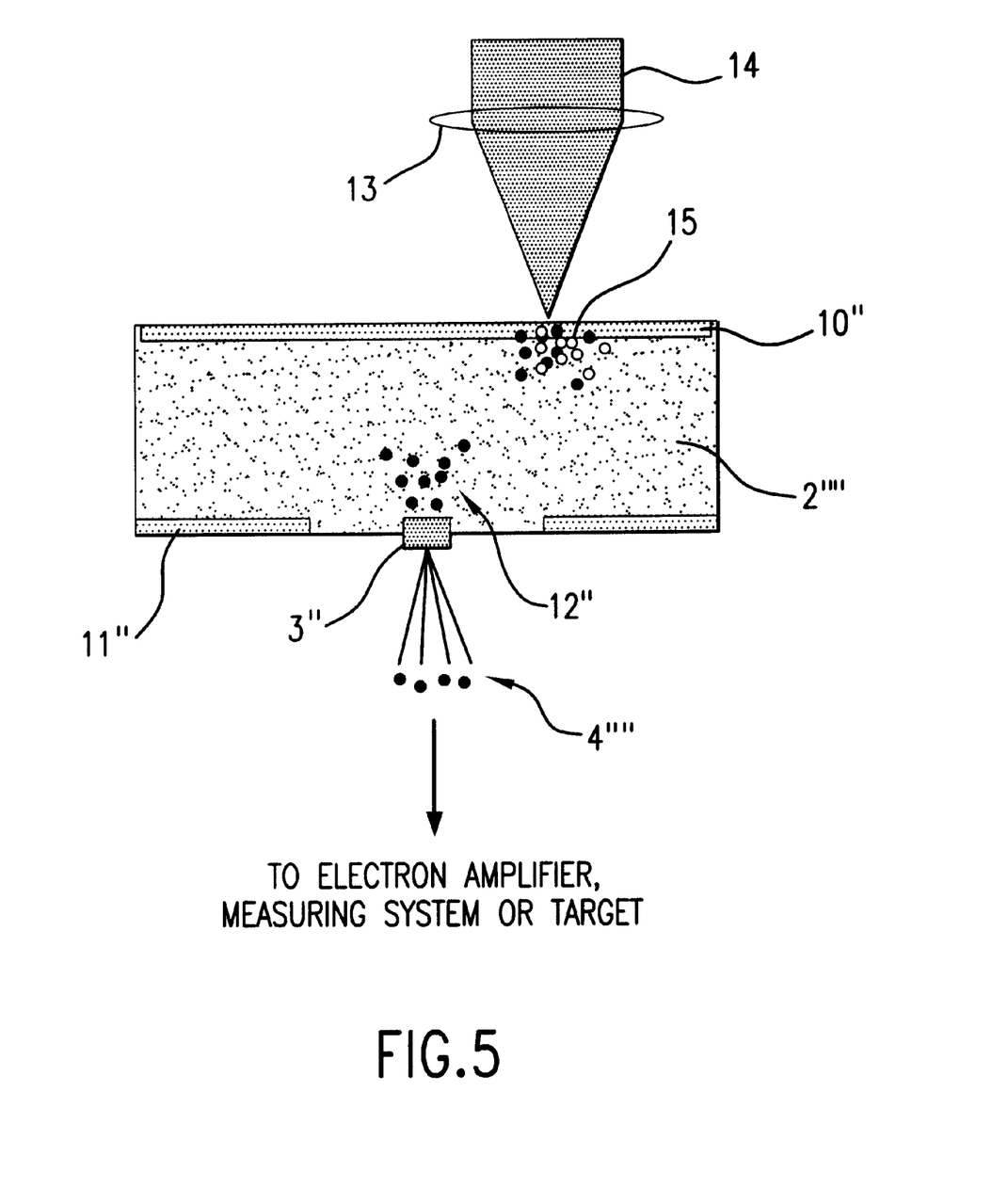
FIG. 5 is a diagram of a second possible application of a radiation assisted electron emission device according to the general embodiment of the present invention.
Figure 6:
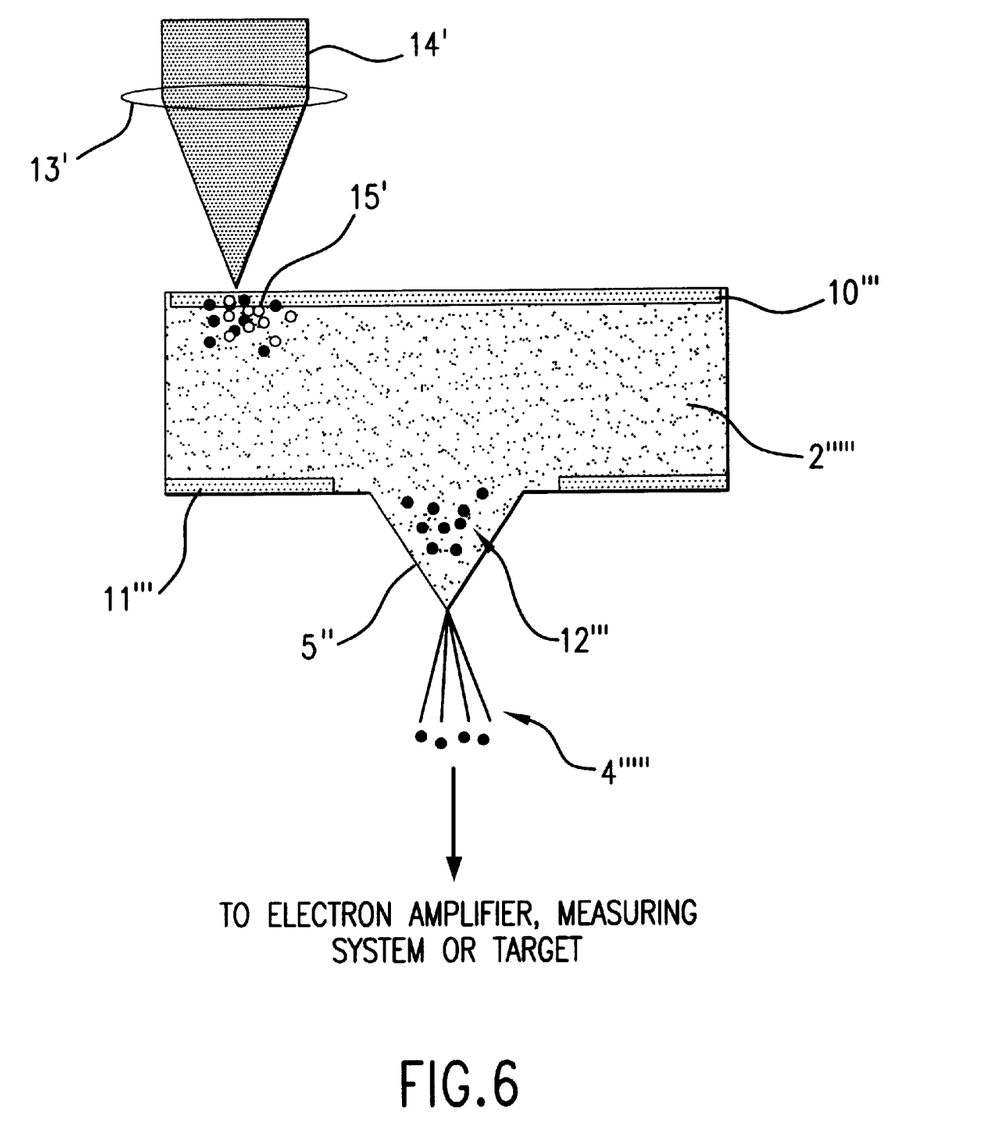
FIG. 6 is a diagram of the second possible application of a radiation assisted electron emission device according to the second embodiment of the present invention.
Figure 7:
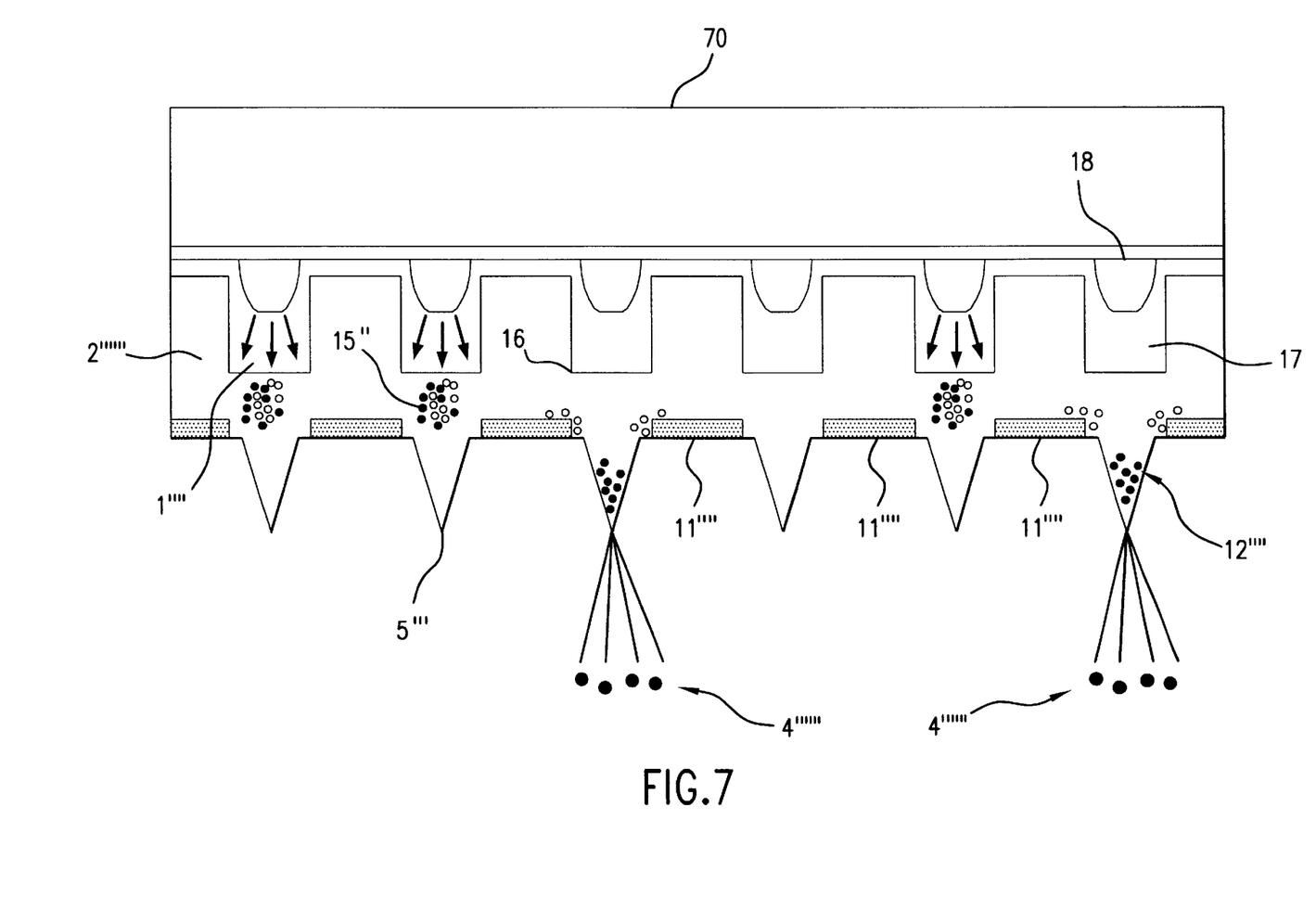
FIG. 7 is a diagram of an array of radiation assisted electron emission sources according to a third embodiment of the present invention.

FIG. 5 shows an example of an embodiment of the present invention wherein a light source 14 is used as the source of ionizing radiation. The light source 14 may be implemented by any appropriate source of light photons, including a laser, light emitting diode, or incandescent light bulb. The light may be focused into the material 2"" by a lens 13. Photons absorbed into the semiconducting or semi-insulating material 2"" excite electron-hole pairs 15, from which electrons 12 are driven to the emission region of mechanism 3 as in the earlier examples disclosed above. The remaining reference numerals describe like elements as disclosed above. FIG. 6 shows an embodiment of the invention wherein the emission mechanism is field emission tip FIG. 7 shows an alternate embodiment of the present invention wherein the RAEED is provided as an array of electron emission devices. An array of light sources 18, such as light emitting or laser diodes, are provided on a substrate material 70 behind an array of field emission tips 5''' formed in semiconducting or semi-insulating material 2''''. The diodes 18 alternately ma be individual devices, or may be fabricated on the same material 2'''' as the field emission tips 5'''. A coupling compound 17 may be inserted between the diodes 18 and the material 2'''' in order to improve light coupling into the material. Wells 16 may be etched directly behind, the field emission tips to improve diffusion and drift of electrons to the field emission tips. The diodes 18 may be turned on and off individually according to the field emission tips that are desired to emit electrons.

Figure 8:
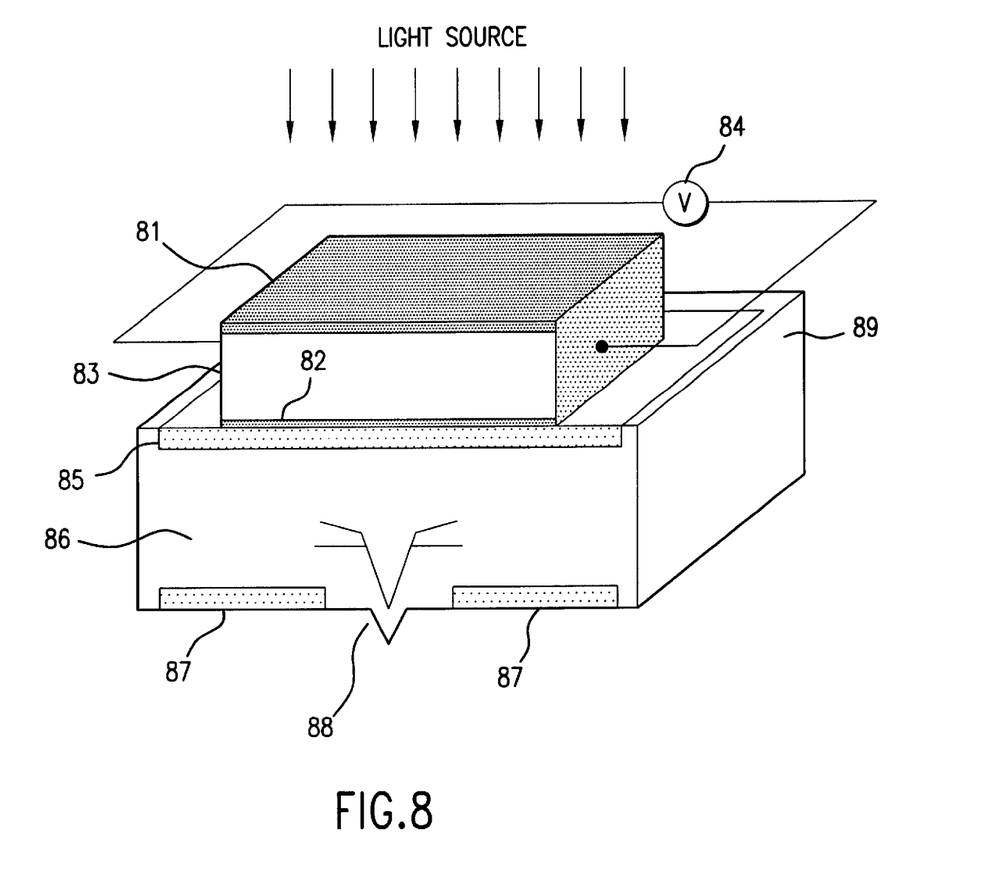
FIG. 8 is a diagram of a radiation assisted electron emission device according to a fourth embodiment of the present invention.

FIG. 8 shows an embodiment of the invention as a depletion mode-operated RAEED. The device operates as follows. A pulse of radiation is incident on initial polarizer 81. Dependent upon the bias applied to birefringent crystal 83 by voltage source 84, the polarization of the incident radiation will change, which determines whether or not the radiation will pass through the second polarizer 82 and into the surface of fully depleted silicon material 89. If the polarization is correct, the radiation creates excited electron-hole pairs in the depleted bulk silicon material. Electrons from the electron-hole pairs are driven to a field emitter 88 by an internal electric field 86 created by a voltage potential applied to P++ doped regions 85 and 87. P++ doped regions 87 serve to focus the electrons to the field emission tip 88. With no electrons in the vicinity of the tip, a net positive charge density exists due to the ionized $N_D$. The extractor also exhibits a net positive charge density. When a charge packet approaches the tip, the electric field will become correspondingly larger, thereby allowing field emission to occur. As the full charge packet is being released from the tip, field emission will become correspondingly smaller, to the point of termination. Thus, as modulated by a birefringent crystal, the radiation source produces a charge packet that creates its own field emission. This embodiment of the invention can be used an electron source to dose electron beam sensitive resists.

Figure 9:
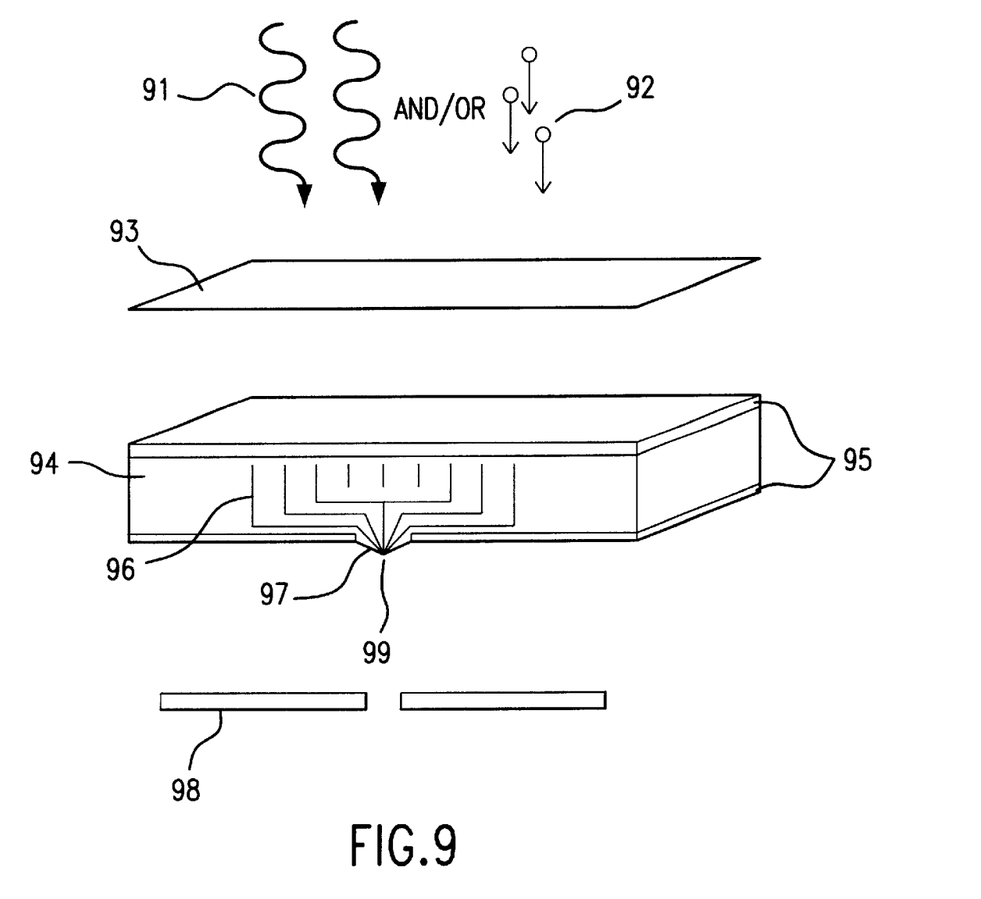
FIG. 9 is a diagram of a radiation assisted electron emission device according to a fifth embodiment of the present invention.

FIG. 9 shows an embodiment of the invention as a single element radiation activated field emitter device. Photons/phonons 91 or charged particles 92 interact with mechanism 93 that controls the flux of incident radiation into bulk semiconductor material 94. Material 94 is operated at a predefined temperature T and is depleted of charge carriers with proper biasing and doping. Doped areas 95 (opposite of the type of the bulk material 94) are used to deplete the bulk material and to shape the internal electric field 96. The primary function of the electric field 96 is to drive the free electrons created by radiation interaction in the bulk semiconductor material to field emitter region 97. The internal electric field also may be used to control mean drift times, generation/recombination rates, avalanche creation, and signal-to-noise ratio of the emission current. The field emitter region 97 may be a single tip or an array of tips. The emission mechanism may be thermionic, Schottky emission, cold field emission, or any combination of these. It may also include a negative electron affinity emission process. Extractor plates 98 apply an additional field to the emitter area, and function to control the emission beam. Depending on the application, the electron beam 99 may travel toward or away from the field emitter area 97.

Examples of Particular Applications (1) Electron Source for E-Beam Writing

The RAEED can be implemented as a single or multiple electron beam source for e-beam writing applications. The radiation dose can be modulated by adjusting the intensity of the incident radiations. (such as photons). For such applications, the device size would be approximately 100 $\mu$m by 100 $\mu$m, allowing approximately 250 active devices per linear inch, operating at 250 MHZ. 1524 devices could be implemented for six inch mask writing. At 250 MHZ, write times can be decreased by 3 orders of magnitude. Such devices will be very stable and reliable, because a high electric field exists at the tip only during electron emission.

(2) Electron Source for E-Beam Metrology

The RAEED can be implemented as a single or multiple electron beam source for metrology applications. Depletion mode backscatter detectors can be fabricated on the same side of the device(s) as the field emitter. The closer the electron source is placed to the surface under investigation, the greater the solid angle, thereby improving the detection efficiency.

(3) Radiation Spectrometer/Imager

In this application, a scintillator is used as the interacting medium. The scintillator photon emission is captured at the topside of the RAEED, and the electron signal of the RAEED is amplified with a high S/N ratio dynode bank or avalanche diode. The signal will be proportional to the energy of the incident photons. If implemented as an array, the X-Y coordinate position of the radiation interaction can be determined.

(4) High Gain/Speed Optical Switch/Router

Assuming single wavelength incident photons, the signal created by the incident photons can be turned on and off by proper biasing of a birefringent crystal. Estimated switching speeds are on the order of 250 MHZ. Amplification of the electron signal can be achieved by increasing extractor voltage to increase the energy of the emitted electrons. When incident on a detecting substrate (such as a p-i-n diode), the signal will be increased in proportion to the increase in extractor voltage. This signal can be used to drive other components in an optical switch/router.

(5) High Reliability Flat Panel Display

The RAEED can be implemented as a high reliability flat panel display, as high electric field is present at the emitter tip only during electron emission. The electron emission can be modulated so that ions do not experience enough drift to interact with the emitter, thereby eliminating the failure mechanism caused by ion attraction to the high electric field emitter, which causes a change in work function when ions interact with the emitter tip.

(6) Modulated Electron Source

The RAEED can be modulated by modulating the intensity of the light source that stimulates or assists in the electron emission. For example, a laser diode as shown in FIG. 7 may be modulated so that the emission of electrons changes in intensity in real time as the light intensity of the laser diode changes. As such, the device does not need to be driven by changing the operating voltages on the device. The operating voltages can remain constant while the electron emission intensity changes as a result of the differences in conductivity of the semiconducting or semi-insulating material, which is controlled by the photoelectric effect from the modulating light source.

The invention having been thus described, it will be apparent to those skilled in the art that the same may be varied in many ways without departing from the spirit and scope of the invention. Any and all such modifications are intended to be included within the scope of the following claims.

What is claimed is:

1. A radiation assisted electron source, comprising:
    semiconducting or semi-insulating material that produces electron-hole pairs when subjected to incident radiation;
    a source of radiation for providing incident radiation to said material, said incident radiation exciting electron-hole pairs within said material;
    an emission mechanism formed in said material; and
    a transport mechanism for driving electrons of said electron-hole pairs to a local region of said emission mechanism, where said electrons are released from said emission mechanism to provide an electron beam.

2. A radiation assisted electron source as set forth in claim 1, further comprising an extractor grid having a voltage potential applied thereto, located proximate said emission mechanism, for assisting in the release of electrons from said material and/or focusing emitted. electrons into a directed beam.

3. A radiation assisted electron source as set forth in claim 1, wherein said emission mechanism is a field emission tip 4.

4. A radiation assisted electron source as set forth in claim 1, wherein said emission mechanism is a thermionic emission tip.

5. A radiation assisted electron source as set forth in claim 1, wherein said emission mechanism is a negative electron affinity emitter.

6. A radiation assisted electron source as set forth in claim 1, wherein said source of radiation is a laser.

7. A radiation assisted electron source as set forth in claim 1, wherein said source of radiation is a light-emitting diode.

8. A radiation assisted electron source as set forth in claim 1, wherein said source of radiation is an incandescent light source.

9. A radiation assisted electron source as set forth in claim 1, wherein said source of radiation is a source of charged particles.

10. A radiation assisted electron source as set forth in claim 1, wherein said source of radiation is a source of neutrons.

11. A radiation assisted electron source as set forth in claim 1, further including a lens to focus incident radiation onto said material.

12. An array of radiation assisted electron sources, comprising:
- semiconducting or semi-insulating material that produces electron-hole pairs when subjected to incident radiation;
- a source of radiation for providing incident radiation to said material, said incident radiation exciting electron-hole pairs within said material;
- a plurality of emission mechanisms formed in said material; and
- a transport mechanism for driving electrons of said electron-hole pairs to local regions of said emission mechanisms, where said electrons are released from said emission mechanisms to provide electron beams.

13. An array of radiation assisted electron sources as set forth in claim 12, further comprising a controller for individually controlling said plurality of emission mechanisms.

14. An array of radiation assisted electron sources as set forth in claim 12, further comprising a plurality of radiation sources each corresponding to each of said plurality of emission mechanisms, each of said plurality of radiation sources being individually controllable.

15. A radiation detector, comprising:
- a scintillating material responsive to incident radiation for generating photon radiation;
- a semiconducting or semi-insulating material that produces electron-hole pairs in response to incident photon radiation from said scintillation material, said incident photon radiation exciting electron-hole pairs within material;
- an emission mechanism formed in said material; and
- a transport mechanism for driving electrons of said of said electron-hole pairs to a local region of said emission mechanism, where said electrons are released from said emission mechanism to provide an electron beam.

* * * * *